United States Patent [19]

Reber

[11] Patent Number: 4,490,440
[45] Date of Patent: Dec. 25, 1984

[54] HIGH TECHNOLOGY JEWELRY AND FABRICATION OF SAME

[76] Inventor: William L. Reber, 16321 Pacific Coast Hwy., #131, Pacific Palisades, Calif. 90272

[21] Appl. No.: 523,683

[22] Filed: Aug. 16, 1983

[51] Int. Cl.$^3$ ............................................. B44D 1/52
[52] U.S. Cl. .................................. 428/620; 428/621; 428/624; 350/162.18; 63/32; 29/160.6
[58] Field of Search ....................... 428/620, 621, 624; 350/162.18; 63/32; 29/160.6

[56] References Cited

U.S. PATENT DOCUMENTS

| | | | |
|---|---|---|---|
| 3,412,575 | 11/1968 | Feldman et al. | 63/32 |
| 3,515,459 | 6/1970 | Wood | 350/162.18 |
| 3,959,527 | 5/1976 | Droege | 63/32 |
| 4,094,575 | 6/1978 | Kellie | 350/162.18 |

*Primary Examiner*—Veronica O'Keefe
*Attorney, Agent, or Firm*—David W. Collins

[57] ABSTRACT

A novel method is provided for producing jewelry that incorporates both computer-aided design and semiconductor processing. The high technology jewelry produced also makes use of microscopic diffraction gratings for generating a dynamic spectral pattern of changing colors when exposed to ambient light such as sunlight, incandescent light, moonlight and the like. The jewelry comprises a semiconductor substrate (10), at least one patterned coating (14) formed on one major surface (12) of the substrate and a transparent layer (28) formed thereover. The patterned coating comprises a material that is capable of being patterned to the dimensions required to diffract incident visible light and includes a series of lines (26) having an arrangement, spacing and width such that incident light will be diffracted in a pleasing pattern. A suitable jewelry mount (44) is attached to the substrate.

30 Claims, 3 Drawing Figures

HIGH TECHNOLOGY JEWELRY AND FABRICATION OF SAME

BACKGROUND OF THE INVENTION

1. Field of the Invention

This invention pertains to high technology jewelry, that is, jewelry designed and fabricated employing state of the art technology, including computer-aided design and semiconductor processing techniques.

2. Description of the Prior Art

While jewelry has provided adornment for men and women from time immemorial, most advances in design and fabrication have occurred only slowly. Curiously, only limited success has been made in marrying jewelry fabrication with the science and technology available at that time.

Exemplary of such recent attempts is the so-called diffraction jewelry, developed some years ago, utilizing diffraction gratings previously developed for use in scientific measurements. Such jewelry, e.g., pendants and earrings, is typically circular and diffracts incident light to provide a myriad of rainbow colors in patterns that are pleasing to the eye. Diffraction jewelry, however, is usually formed by embossing the grating in aluminized Mylar supported on a plastic substrate. These replicated gratings lack the precise detail and high quality which could be achieved using state of the art technology available at the present time.

SUMMARY OF THE INVENTION

In accordance with the invention, a decorative article of manufacture is provided. The decorative article, also termed herein as high technology jewelry, comprises:
 (a) a semiconductor substrate;
 (b) a coating formed on at least one side of the substrate; and
 (c) a transparent layer formed on the surface of the coating.

The substrate coating is patterned prior to forming the transparent layer thereon. The pattern comprises a series of lines having an arrangement, width and spacing such that incident light will be diffracted in a pleasing pattern.

The process of the invention comprises:
 (a) providing a semiconductor substrate;
 (b) forming a patterned coating on at least one surface of the substrate, the pattern capable of diffracting incident light; and
 (c) providing a protective transparent layer on the patterned coating.

The aesthetically pleasing pattern is conveniently generated employing computer-aided design techniques, and is formed in the substrate coating using lithographic processes.

The transparent layer serves to protect the underlying patterned coating. The finished product is durable, resistant to scratches and abrasion and evidences a high spectral diffraction efficiency. Further, the high technology jewelry of the invention evidences a precise detail, provided by the use of computer-aided design equipment, and a high quality, provided by the use of state of the art semiconductor processing.

Other advantages of the invention will become apparent from a study of the following portion of the specification, the claims and the attached drawings, in which like numbers represent like elements.

DETAILED DESCRIPTION OF THE INVENTION

In fabricating the high technology jewelry of the invention, a semiconductor substrate is provided. The substrate preferably comprises silicon, but may also comprise other suitable semiconductor materials, such as germanium or gallium arsenide. The properties of the substrate itself are not important, other than it be of a thickness and durability to withstand the rigors of processing and subsequent handling by the wearer. Indeed, the usual concern in semiconductor fabrication as to purity, dopant species, dopant concentration, conductivity type and the like are inconsequential; reject quality material may suitably be employed. Nor is cleaning required to the same extent as in conventional semiconductor processing. The surface of the substrate need only be cleaned sufficiently to accept a coating, such as described below. Exemplary of such cleaning procedures is a dip in trichloroethylene.

Figure 1A:
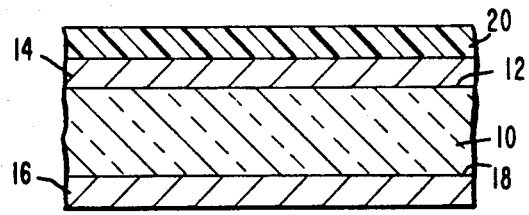
FIGS. 1a–d depict, in cross-section, portions of the process employed in fabricating the high technology jewelry of the invention.

As depicted in FIG. 1a, a semiconductor substrate 10, here silicon, is shown, having formed on one major surface 12 (the front surface) thereof a coating 14. A coating 16 may optionally be provided on the back major surface 18 for aesthetic purposes.

Wafers are appropriately employed as substrates. In the conventional fabrication of silicon-based devices, wafers about 3 to 4 inches in diameter are generally used at the present time, and such wafers, which are typically about 20 mils thick, are suitably used herein. However, other diameters and thicknesses may be employed as the state of the art advances.

The coating 14 (and 16) comprises any material that reflects light in the visible region of the spectrum, but is preferably a metal, such as gold, aluminum, silver, titanium, nickel, tantalum and the like. Alternatively, photoresist may be employed as the coating, since at appropriate spacings of lines patterned therein, it, too, will diffract incident light. However, a metallic coating is preferred because of the decorative effect of the presence of the metal itself (e.g., gold, aluminum, silver, etc.). In any event, the material comprising the coating must be one that is capable of being patterned to the dimensions required to diffract incident visible light.

The thickness of the coating 14 advantageously ranges from about 0.5 to 1 micrometer. Although the thickness is not particularly critical, it is desirably uniform. For thicknesses considerably less than about 0.5 micrometer, pinholes may develop during deposition, or the coating may be too thin, and thus at least partially transparent, leading to a decrease in reflectivity. On the other hand, for thicknesses considerably greater than about 1 micrometer, undesirably longer processing times are encountered, with unnecessary waste of material.

The coating 14 is suitably formed on the surface of the substrate 10 by deposition processes conventional in the art of semiconductor fabrication, such as vacuum deposition, sputtering, etc.

Next, the coating is patterned, employing conventional lithographic techniques. While many such techniques are available, photolithography is preferred because it is the most economical. A mask having the desired pattern incorporated therein is employed in the patterning process. The process for preparing the patterned mask is described next, followed by a description of its use in the patterning process.

The desired pattern is first generated, using well-known computer-aided design (CAD) techniques, within a computer data base. CAD permits greater freedom in the initial design phase and is not limited by the constraints of optical and mechanical considerations associated with the conventional fabrication of diffraction jewelry by interference techniques. Indeed, CAD is limited only by the imagination of the user. Many pleasing patterns, including graphics symbols, alphanumeric characters and imagery, such as pictures and digitized lines, not otherwise achievable with prior art optical approaches, are easily within the domain of CAD.

In using CAD, geometric information is represented in the data base relating to line spacing, line width and line length, as well as to the arrangement of a series of lines, such that the completed pattern in coating 14 will itself be geometrically pleasing, and will produce an aesthetically pleasing diffraction pattern when exposed to light in the visible region (e.g., sunlight, incandescent light, moonlight). Once the desired pattern is generated, then a pattern generation (PG) tape is prepared, based on the layout of the geometric pattern. A photolithographic mask is then prepared from the PG tape. As is well-known, a camera is used to produce a reticle from which a step-and-repeat master is first made, which is then used to make one or more working plates, as needed. Such working plates are used to transfer the geometric design by contact onto a photoresist layer, formed on the surface of the coating 14.

Figure 1B:
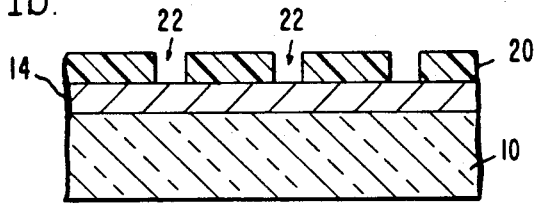
Figure 1C:
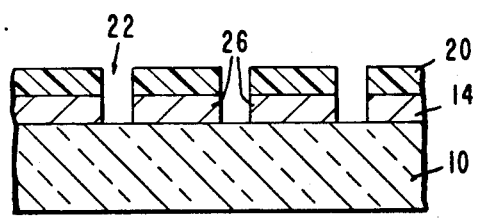

Continuing in the description of the process of fabricating the decorative article of manufacture of the invention, a photoresist layer 20 is deposited on the coating 14, as shown in FIG. 1a. A positive photoresist, such as Shipley AZ 1350 is, may be employed, since in such materials, regions exposed to actinic radiation to form the pattern are cross-linked (polymerized) relative to unexposed regions. However, negative resists may also be suitably employed in the practice of the invention. A working plate (not shown) containing the desired pattern is used in the contact photolithographic process to provide regions in the photoresist layer 20 which replicate corresponding regions in the working plate. Following exposure to actinic radiation, exposed regions are then removed, such as by a wet process (chemical etching) or a dry process (plasma etching). The removed regions thereby expose underlying portions of the coating 14 through openings 22, shown in FIG. 1b. The exposed portions of the coating 14 are then etched, either chemically, such as with an appropriate acid (metal coating) or solvent (photoresist coating), or with plasma, to generate a relief pattern. The etching advantageously removes material all the way to the surface 12 of the substrate 10, further extending the openings 22, as shown in FIG. 1c. Alternatively, the etching may remove only a portion of the exposed regions, so long as the openings are of sufficient depth such that, in conjunction with the width of the lines 26 thus produced, the relief is of sufficient dimension so as to provide diffraction of incident light. The remaining photoresist layer employed in the lithographic process is removed with a suitable solvent, leaving a patterned series of lines 26 in the coating 14, as seen in cross-section in FIG. 1d and in plan view in FIG. 2.

Alternatively, the photoresist layer 20 may be deposited directly on the substrate 10 and patterned as above to form openings 22. The coating 14 may then be deposited over the entire photoresist layer, including the openings 22. Then, employing well-known "lift-off" techniques, the photoresist may be removed, taking with it the coating formed thereon, but leaving behind those portions of the coating filling the openings, thereby providing the patterned coating on the substrate.

The width and spacing of the lines 26 are judiciously selected so as to be consistent with the particular processing chemistry employed. Further, the ratio of line width to line spacing should range from about 1:1 to 3:1 to maximize the diffraction effect. Finally, the line frequency should range from about 50 to 800 lines per millimeter. Less than about 50 lines per millimeter may not provide the desired aesthetic effect, while greater than about 800 lines per millimeter would result in unnecessarily high processing costs. Examples of suitable line widths and line spacings include (a) 7 micrometers (w) and 3 micrometers (s) and (b) 6 micrometers (w) and 4 micrometers (s).

Figure 1D:
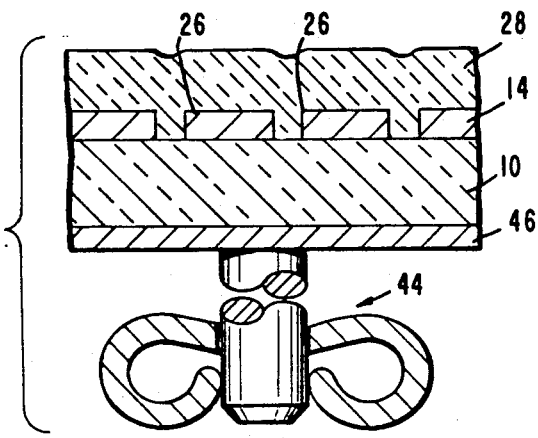

A transparent layer 28 is then deposited over at least the patterned coating 14 on the substrate 10, as shown in FIG. 1d, to form the finished product. Such a layer must be durable in order to protect the underlying coating 14 against scratches, abrasion, etc., and may comprise an oxide, such as silicon dioxide or silica-based glass, or a plastic, such as a polymide or a polyurethane. The deposition of such materials is well-known.

The layer 28 is deposited to a thickness of about 1 to 3 micrometers. At thicknesses substantially less than about 1 micrometer, the layer will not adequately protect the underlying coating, while at thicknesses substantially greater than about 3 micrometers, the layer could craze, which would tend to destroy the aesthetic effect of the final product. The layer 28 is substantially transparent, in order to permit the maximum diffraction effects to be perceived.

There are many considerations in selecting patterns that will diffract incident light in a pleasing manner. One such pattern is partially depicted in FIG. 2. There, a series of cells 30 are arranged in a geometric pattern to form the novel jewelry piece of the invention. Cells comprising a series of lines 26, such as cell 32 or cell 36, are considered to be "live" cells; that is, these are cells which will diffract incident light. Other regions, such as region 38, may be formed by the absence of lines 26, comprising instead relatively flat areas. Such regions are considered to be "dead" regions, since they do not diffract incident light. Thus, patterns may be created out of combinations of live cells and dead regions.

In general, the basic cell comprises a particular orientation of parallel lines 26. Rows may comprise basic cells having the same or alternating or other orientation. The basic cell may be rotated 90 degrees to achieve another basic cell having an orthogonal orientation. Other orientations and composite designs, such as graphics symbols, alphanumeric characters and imagery, are also possible. Thus, the composite cell comprises a pattern of basic cells providing regions of diffraction gratings having different orientations of their lines, thereby giving rise to interesting optical reflections from the jewelry when illuminated by ambient light.

Figure 3:
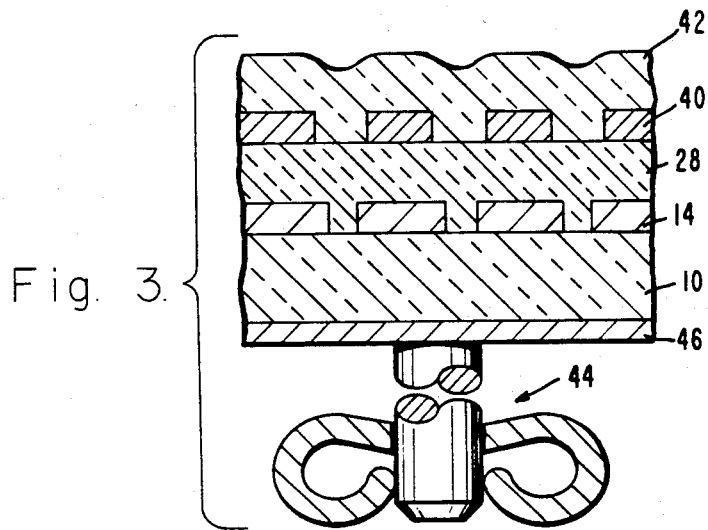
FIG. 3 depicts, in cross-section, a second embodiment of the invention.

Additional pleasing patterns may be achieved by depositing a second coating 40 over the first coating 14, optionally spaced apart by oxide 28, as shown in FIG. 3. Other suitable materials, such as polyimides, which provide a smooth surface, may preferably be employed. The second coating is patterned employing the same process as that used for the first coating, and a protective layer 42 is formed over the entire composite, employing the same process as that used for layer 28. The second coating may, if desired, comprise a flash coating of a more expensive metal over an inexpensive patterned metal coating.

The second coating may comprise the same material as that of the first coating or may comprise dissimilar materials (e.g., gold over aluminum) to obtain a pleasing effect. The use of two coatings also permits the formation of Moire patterns, which, if suitably chosen, provide an aesthetically pleasing compliment to the diffraction patterns generated by each coating. The second level of coating may be in an orientation parallel to the first coating, as depicted in FIG. 3, or orthogonal thereto or at some intermediate angle thereto.

In fabricating the high technology jewelry of the invention, a plurality of jewelry pieces are simultaneously formed on a single wafer. The water is then diced and sliced, using well-known techniques, to provide the individual jewelry pieces.

The jewelry pieces are then individually provided with a jewelry finding 44 (shown in FIGS. 1d and 3), which enables the coated substrate to be worn as an earring (as depicted here), a pendant, bracelet, ring, brooch, necklace, tie tack, tie bar, cuff links, or other decorative object. The jewelry finding is attached to the substrate 10 by conventional means, such as with a suitable epoxy. Preferably, the jewelry finding may include a pedestal mount 46, such as metal or plastic, which is attached to the substrate to provide additional support.

EXAMPLE

Figure 2:
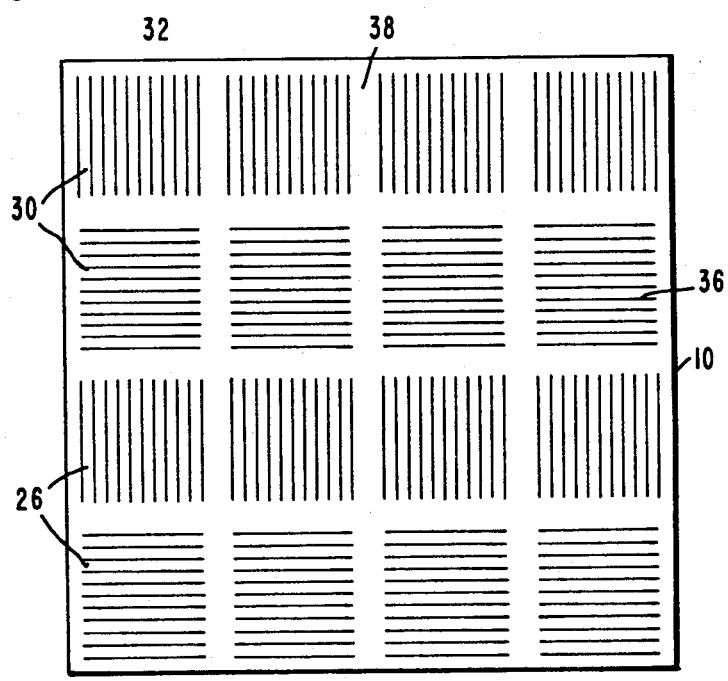
FIG. 2 depicts, in greatly enlarged plan view, an example of a pattern capable of producing an aesthetically pleasing output of diffracted light.

A pair of earrings was fabricated, having a repetitive pattern similar to that depicted in FIG. 2. A silicon wafer, 3 inches in diameter and 20 mils thick, was processed to provide a plurality of jewelry pieces, each measuring about 1×1 centimeter. A coating of aluminum, 1 micrometer thick, was formed on the surface of the silicon wafer by vacuum deposition. The jewelry pieces were patterned with live cells approximately 2.5 millimeters square, having lines spaced 3 micrometers apart and 7 micrometers in width, employing Shipley AZ 1350 positive photoresist. Dead cells were interspersed at regular intervals. A protective layer of phosphorus-containing silica glass, 1 micrometer in thickness, was formed on the patterned coating, using Silox. The resulting decorative articles of manufacture were provided with the appropriate jewelry findings and were observed to evidence a high degree of spectral diffraction in ambient light.

The invention has been described in its presently contemplated best mode and it is clear that it is susceptible to numerous modifications, modes and embodiments within the ability of those skilled in the art and without the exercise of the inventive faculty. Therefore, the scope of this invention is defined by the scope of the following claims.

What is claimed is:

1. A decorative article of manufacture, comprising:
   (a) a semiconductor substrate;
   (b) a patterned coating formed on a major surface of said substrate, said patterned coating having formed therein a series of lines arranged in a variety of patterns such that incident light will be diffracted in a pleasing pattern, said lines evidencing a ratio of the line width to line spacing of about 1:1 to 3:1, with about 50 to 800 lines per millimeter; and
   (c) a transparent layer formed over said patterned coating.

2. The article of claim 1 in which said semiconductor substrate consists essentially of silicon.

3. The article of claim 1 in which said patterned coating ranges from about 0.5 to 1 micrometers in thickness.

4. The article of claim 1 in which said patterned coating consists essentially of a metal selected from the group consisting of gold, aluminum, silver, titanium, nickel and tantalum.

5. The article of claim 4 in which said patterned coating is selected from the group consisting of gold, aluminum and silver.

6. The article of claim 1 in which said patterned coating comprises a first patterned metallic coating formed on said semiconductor substrate and a second patterned metallic coating formed thereover.

7. The article of claim 6 in which the metals comprising the patterned metallic coatings are separated by a transparent layer.

8. The article of claim 7 in which said transparent layer consists essentially of a polymide.

9. The article of claim 6 in which the metals are independently selected from the group consisting of gold, aluminum and silver.

10. The article of claim 1 in which said transparent layer consists essentially of a material selected from the group consisting of transparent oxides and transparent plastics.

11. The article of claim 10 in which said transparent layer consists essentially of a material selected from the group consisting of silica-based materials, polyurethanes and polyimides.

12. The article of claim 1 in which said transparent layer ranges from about 1 to 3 micrometers in thickness.

13. The article of claim 1 further including a jewelry mount attached to said semiconductor substrate.

14. A decorative article of manufacture comprising:
   (a) a silicon substrate;
   (b) a patterned metallic coating formed on a major surface of said substrate, said patterned coating having formed therein a series of lines arranged in a variety of patterns such that incident light will be diffracted in a pleasing pattern, said lines evidencing a ratio of line width to line spacing of about 1:1 to 3:1, with about 50 to 800 lines per millimeter; and
   (c) a layer consisting essentially of a silica-based material formed over said patterned coating.

15. The article of claim 14 in which said patterned metallic coating consists essentially of a metal selected from the group consisting of gold, aluminum and silver.

16. The article of claim 14 in which said patterned metallic coating ranges from about 0.5 to 1 micrometer in thickness and said silica-based layer ranges from about 1 to 3 micrometers in thickness.

17. The article of claim 14 further including a jewelry mount attached to said silicon substrate.

18. A process for fabricating a decorative article of manufacture comprising:
(a) providing a semiconductor substrate;
(b) forming a patterned coating on a major surface of said semiconductor substrate, said patterned coating formed by a process which includes:
  (1) generating geometric data in a data base, said geometric data representing line spacing, line width and line arrangement relating to said pattern,
  (2) preparing a lithographic mask based on said geometric data, and
  (3) employing said lithographic mask to generate said pattern in said coating, the pattern capable of diffracting incident light in a pleasing pattern and having a series of lines arranged in a variety of patterns, said lines having a ratio of line width to line spacing of about 1:1 to 3:1, with about 50 to 800 lines per millimeter; and
(c) forming a protective transparent layer on said patterned coating.

19. The process of claim 18 in which semiconductor substrate consists essentially of silicon.

20. The process of claim 18 in which said coating is formed to a thickness ranging from about 0.5 1 micrometer.

21. The process of claim 18 in which said coating consists essentially of a metal selected from the group consisting of gold, aluminum, silver, titanium, nickel and tantalum.

22. The process of claim 21 in which said metal is selected from the group consisting of gold, aluminum and silver.

23. The process of claim 21 in which a second metallic coating is formed on the patterned metallic coating.

24. The process of claim 23 in which the two metallic coatings are spaced apart by a transparent layer.

25. The process of claim 24 in which said two metallic coatings are spaced apart by a polymide layer.

26. The process of claim 23 in which said metals are independently selected from the group consisting of gold, aluminum and silver.

27. The process of claim 18 in which said transparent layer consists essentially of a material selected from the group consisting of transparent oxides and transparent plastics.

28. The process of claim 27 in which said transparent layer consists essentially of a material selected from the group consisting of silica-based materials, polyurethanes and polyimides.

29. The process of claim 18 in which said transparent layer is formed to a thickness ranging from about 1 to 3 micrometers.

30. The process of claim 18 further comprising attaching a jewelry mount to said semiconductor substrate.

* * * * *